(12) United States Patent
Schwarzer et al.

(10) Patent No.: US 8,981,553 B2
(45) Date of Patent: Mar. 17, 2015

(54) POWER SEMICONDUCTOR MODULE WITH INTEGRATED THICK-FILM PRINTED CIRCUIT BOARD

(71) Applicant: Infineon Technologies AG, Neubiberg (DE)

(72) Inventors: Ulrich Michael Georg Schwarzer, Warstein (DE); Daniel Bolowski, Warstein-Suttrop (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 13/623,994

(22) Filed: Sep. 21, 2012

(65) Prior Publication Data

US 2013/0075932 A1    Mar. 28, 2013

(30) Foreign Application Priority Data

Sep. 22, 2011 (DE) .......................... 10 2011 083 223

(51) Int. Cl.
| | | |
|---|---|---|
| *H01L 23/053* | (2006.01) | |
| *H01L 23/48* | (2006.01) | |
| *H01L 23/522* | (2006.01) | |
| *H01L 23/36* | (2006.01) | |
| *H01L 23/373* | (2006.01) | |
| *H01L 23/498* | (2006.01) | |
| *H01L 25/07* | (2006.01) | |

(52) U.S. Cl.
CPC .......... *H01L 23/5226* (2013.01); *H01L 23/36* (2013.01); *H01L 23/3735* (2013.01); *H01L 23/49811* (2013.01); *H01L 23/49827* (2013.01); *H01L 23/49833* (2013.01); *H01L 23/49844* (2013.01); *H01L 25/072* (2013.01); *H01L 2224/24* (2013.01)

USPC .......... 257/701; 257/706; 257/713; 257/774; 257/686; 257/E23.101

(58) Field of Classification Search
CPC .............. H01L 23/481; H01L 2224/80; H01L 2224/16145; H01L 25/0657
USPC .................. 257/701, 706, 713, 774, E23.101
See application file for complete search history.

(56) References Cited

U.S. PATENT DOCUMENTS

| | | | | |
|---|---|---|---|---|
| 6,265,771 B1 * | 7/2001 | Ference et al. | ................ | 257/706 |
| 6,266,772 B1 * | 7/2001 | Suzuki | ......................... | 713/182 |
| 7,388,293 B2 * | 6/2008 | Fukase et al. | ................ | 257/774 |
| 7,723,838 B2 * | 5/2010 | Takeuchi et al. | ............. | 257/700 |
| 7,906,843 B2 * | 3/2011 | Palanduz | ..................... | 257/701 |

(Continued)

*Primary Examiner* — Nitin Parekh
(74) *Attorney, Agent, or Firm* — Murphy, Bilak & Homiller, PLLC

(57) ABSTRACT

A power semiconductor module includes a first printed circuit board having a first insulation carrier, and a first upper metallization and a first lower metallization applied to the first insulation carrier on mutually opposite sides, and a second printed circuit board having a second insulation carrier and a second upper metallization applied to the second insulation carrier. The second printed circuit board is spaced apart from the first printed circuit board in a vertical direction oriented perpendicular to the opposite sides of the first insulation carrier. A semiconductor chip is disposed between the printed circuit boards and electrically conductively connected at least to the second upper metallization. The first lower metallization and the second upper metallization face one another. The first printed circuit board has a first thick conductor layer at least partly embedded in the first insulation carrier and which has a thickness of at least 100 μm.

21 Claims, 13 Drawing Sheets

(56) References Cited

U.S. PATENT DOCUMENTS

| | | | |
|---|---|---|---|
| 8,018,045 B2* | 9/2011 | En et al. | 257/700 |
| 8,179,678 B2* | 5/2012 | Yamashita et al. | 361/715 |
| 8,536,696 B2* | 9/2013 | Hirose et al. | 257/701 |
| 8,704,359 B2* | 4/2014 | Tuominen et al. | 257/700 |
| 2002/0020898 A1* | 2/2002 | Vu et al. | 257/676 |
| 2004/0140555 A1* | 7/2004 | Shibata | 257/723 |
| 2006/0091525 A1* | 5/2006 | Hajime et al. | 257/701 |
| 2011/0031610 A1* | 2/2011 | Yamazaki et al. | 257/693 |

* cited by examiner

POWER SEMICONDUCTOR MODULE WITH INTEGRATED THICK-FILM PRINTED CIRCUIT BOARD

PRIORITY CLAIM

This application claims priority to German Patent Application No. 10 2011 083 223.8, filed on 22 Sep. 2011, the content of said German application incorporated herein by reference in its entirety.

BACKGROUND

The construction of modern power semiconductor modules is very complex and requires a multiplicity of soldering connections or other cohesive connections between a wide variety of components, for example between the metallization of a circuit carrier and an external load terminal pin which is electrically contact-connected again outside the module. However, such a connection is associated with an electrical contact resistance, and also the risk of the connection aging over time. Apart from that the production of such a connection is associated with great outlay.

Furthermore, the power density in power semiconductor modules is constantly increasing and so it is problematic to dissipate the heat loss occurring during operation.

SUMMARY

According to one embodiment, a power semiconductor module comprises a first printed circuit board, a second printed circuit board spaced apart from the first printed circuit board in a vertical direction, and a semiconductor chip. The first printed circuit board has a first insulation carrier, and a first upper metallization and a first lower metallization applied to the first insulation carrier on mutually opposite sides. The second printed circuit board comprises a second insulation carrier and a second upper metallization applied to the second insulation carrier. The semiconductor chip is arranged between the first printed circuit board and the second printed circuit board and is electrically conductively connected at least to the second upper metallization. The first lower metallization and the second upper metallization face one another. The first printed circuit board comprises a first thick conductor layer at least partly embedded in the first insulation carrier and which has a thickness of at least 100 μm.

The use of such a thick conductor layer makes it possible to transfer high currents within the first printed circuit board. If the thick conductor layer is led out laterally from the first insulation carrier, then the partial section led out can be used as an electrical terminal. This has the advantage that for the relevant terminal it is not necessary for a terminal pin to be soldered onto that side of the first printed circuit board which faces away from the semiconductor chip, or to be cohesively connected in some other way, and so an increase in resistance associated with such a cohesive connection does not occur. In addition, no space for this external terminal pin has to be reserved on that side of the first printed circuit board which faces away from the semiconductor chip. Instead, in addition to a heat sink on that side of the second printed circuit board which faces away from the power semiconductor chip, a further heat sink can be arranged on that side of the first printed circuit board which faces away from the semiconductor chip, thus resulting in efficient cooling of the power semiconductor module on two sides.

Those skilled in the art will recognize additional features and advantages upon reading the following detailed description, and upon viewing the accompanying drawings.

BRIEF DESCRIPTION OF THE FIGURES

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
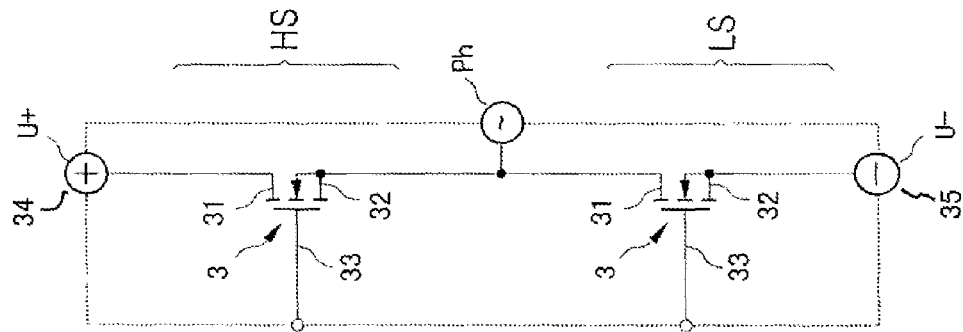
FIG. 1 shows a circuit diagram of a half-bridge comprising two controllable power semiconductor switches, the load paths of which are connected in series.

FIG. 1 shows a circuit diagram of a half-bridge comprising two controllable power semiconductor switches 3, each of which has a first load terminal 31 and a second load terminal 32, and also a control terminal 33, by means of which an electric current between the first and second load terminals 31, 32 can be switched on and/or off or set to an arbitrary value between 0 A (amperes) and the maximum current occurring when the controllable semiconductor switch is fully turned on. The path, via which the current flows between the load terminals 31 and 32, is also designated as the load path. As can be seen in FIG. 1, the load paths of the two controllable power semiconductor switches 3 are connected in series, thereby giving rise to a half-bridge. Optionally, each of the power semiconductor switches 3 can have an auxiliary source terminal (not illustrated).

Furthermore, terminals 34 and 35 are provided, which serve for connecting the half-bridge to electrical operating potentials U+ and U− respectively. The terminal 34 for the positive operating potential U+ is connected to the first load terminal 31 of the upper semiconductor switch 3, and the terminal 35 for the negative operating potential U− is connected to the second load terminal 32 of the lower semiconductor switch 3. The semiconductor switch 3 situated closer to the terminal 34 is also designated as a "high side switch" (HS) of the half-bridge, and the semiconductor switch 3 situated closer to the terminal 35 is correspondingly designated as a "low side switch" (LS).

Furthermore, a phase output Ph is provided, which is electrically conductively connected both to the second load terminal 32 of the upper semiconductor switch 3 and to the first load terminal 31 of the lower semiconductor switch 3. As a result, a potential present at the phase output Ph can be set in a manner dependent on the driving of the two semiconductor switches 3 via their respective control terminals 33 and via auxiliary source terminals which can also be present.

If, in a half-bridge of this type, the upper semiconductor switch 3 (HS) is switched on and the lower semiconductor switch 3 (LS) is switched off, substantially the positive operating potential U+ is present at the phase output Ph. In the opposite case, if the upper semiconductor switch 3 (HS) is switched off and the lower semiconductor switch 3 (LS) is switched on, substantially the negative operating potential U− is present at the phase output Ph. In this way, a potential profile that substantially alternates between the positive operating potential U+ and the negative operating potential U− can be generated by a constant alternation between the two states explained at the phase output Ph.

In order to prevent both semiconductor switches 3 (HS and LS) from being switched on simultaneously during the changeover between the two states, a short safety time interval within which both semiconductor switches 3 (HS, LS) are switched off can be provided upon every alternation.

In the case of the example in accordance with FIG. 1, the controllable semiconductor switches 3 are embodied as MOSFETs. However, any other controllable semiconductor switches 3 such as, for example, transistors, IGBTs or thyristors or JFETs can likewise be used. Optionally, there is additionally also the possibility of connecting a respective freewheeling diode parallel with the load path of each of the controllable semiconductor switches 3.

Figure 2:
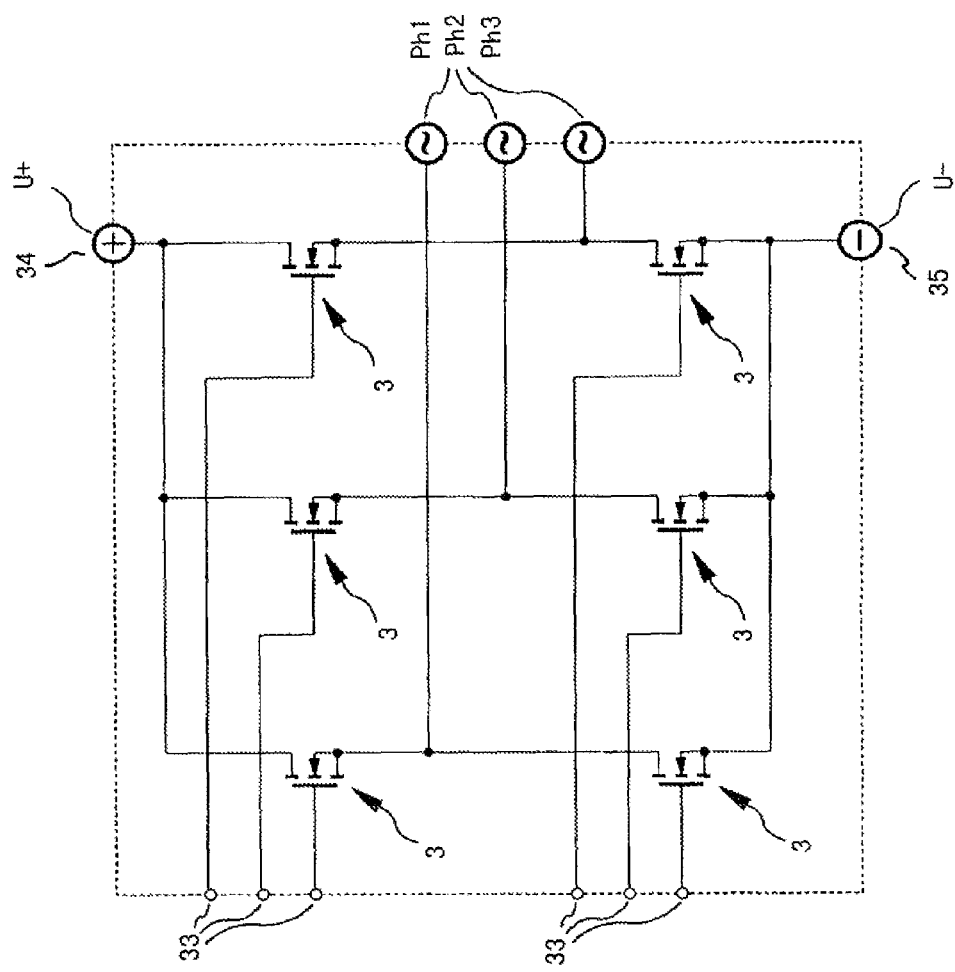
FIG. 2 shows a circuit diagram of a triple half-bridge.

FIG. 2 shows a circuit diagram comprising three half-bridges connected to a common supply voltage, each of which half-bridges is identical in respect of construction and function to the half-bridge explained with reference to FIG. 1 or can be operated identically. The control terminals 33 of the individual controllable semiconductor switches 3 can be driven separately and independently of one another. The phase outputs of the different half-bridges are designated by Ph1, Ph2 and Ph3, respectively. They are likewise independent of one another.

In a corresponding manner, other arrangements such as, for example, double half-bridges comprising only two half-bridges or else four or more half-bridges can also be operated from a common supply voltage.

Half-bridge circuits, such as have been explained by way of example with reference to FIGS. 1 and 2, but also any other semiconductor circuits, can be realized by means of a construction technology whose principles are explained with reference to the following figures.

Figure 3A:
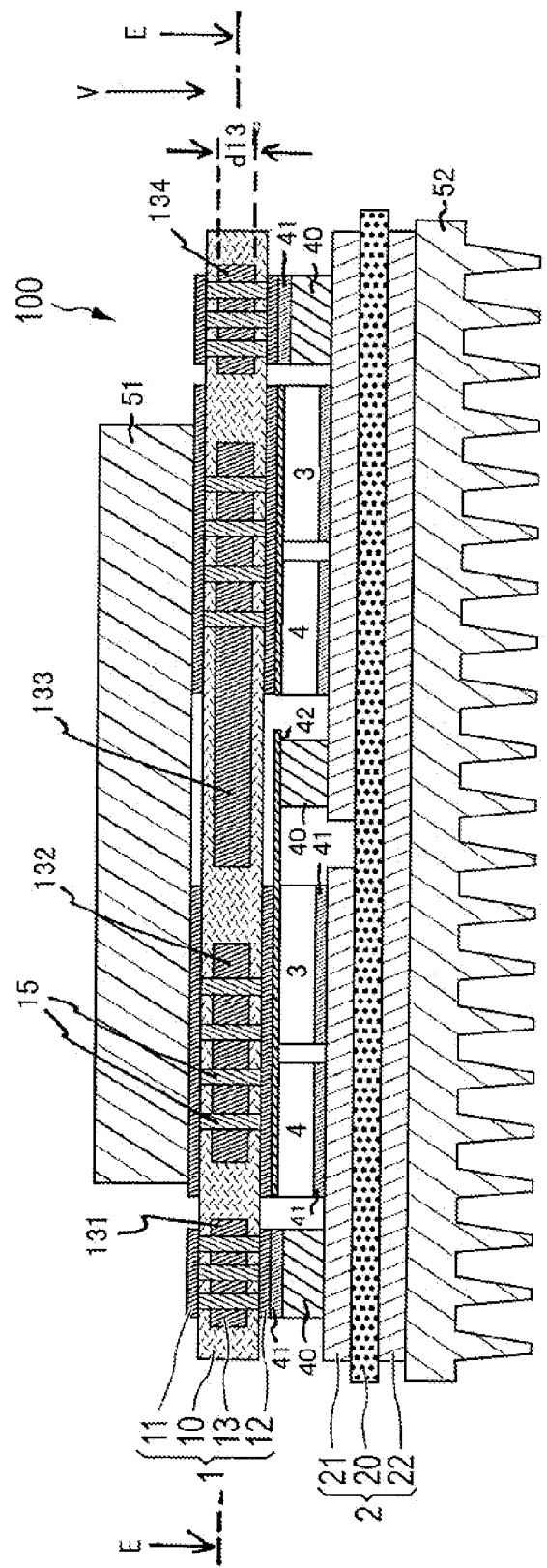
FIG. 3A shows a vertical section through a power semiconductor module cooled on two sides and comprising two printed circuit boards, one of which has a thick metallization layer.

FIG. 3A shows a vertical section through a power semiconductor module 100. The module 100 comprises at least one semiconductor chip 3, 4. The semiconductor chips 3 can be, for example, two controllable semiconductor chips, the load paths of which are connected in series to form a half-bridge in accordance with the circuit diagram shown in FIG. 1. The optional semiconductor components 4 are in each case a freewheeling diode, each of which is connected in parallel with a different one of the controllable semiconductor switches 3.

The module 100 further comprises a first printed circuit board 1 comprising an insulation carrier 10, which is provided with a first upper metallization layer 11 and a lower first metallization layer 12 on each of the opposite sides. A thick conductor layer 13 is partly embedded into the insulation carrier 10. The thick conductor layer 13 has a thickness d13 of at least 100 µm or of at least 400 µm in the vertical direction v. Optionally, the thickness d13 can be chosen to be less than or equal to 2 mm. The first thick conductor layer 13 has at least two sections 131, 132, 133, 134 spaced apart from one another.

The first printed circuit board 1 can be either a conventional printed circuit board having a non-ceramic insulation carrier 10, or else a ceramic substrate having a ceramic insulation carrier 10.

Figure 3B:
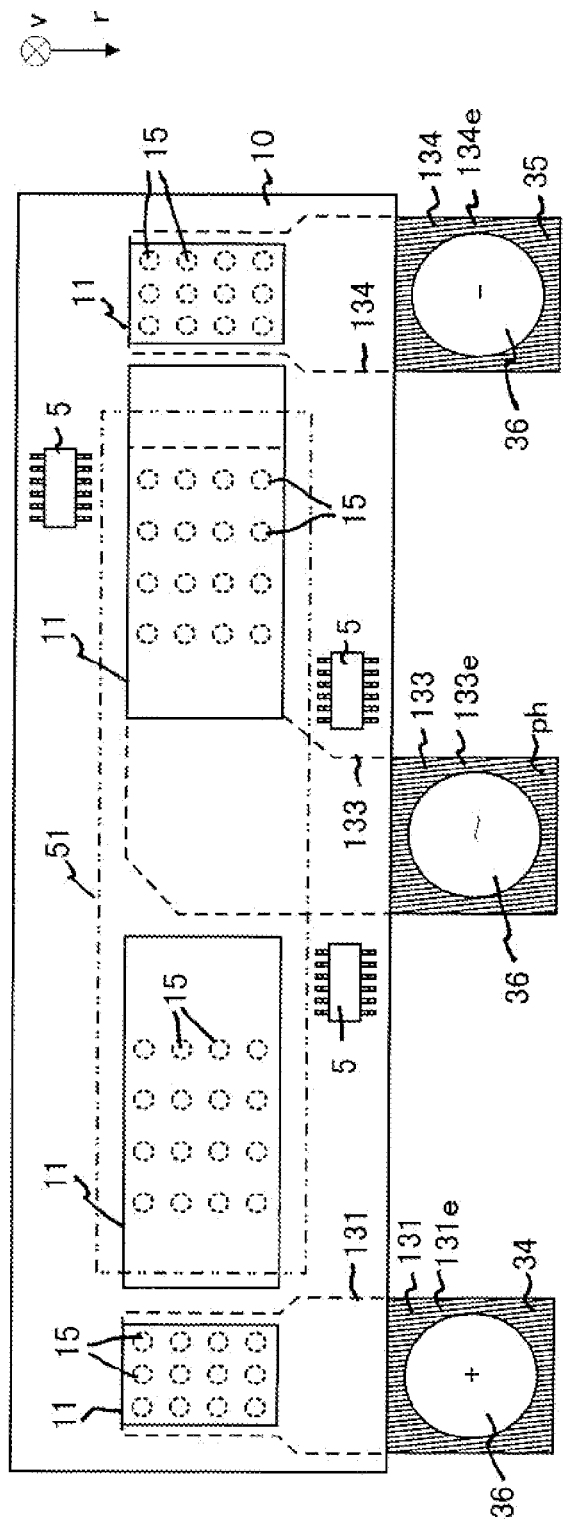
FIG. 3B shows a plan view of the power semiconductor module in accordance with FIG. 3A.

FIG. 3B shows a plan view of the power semiconductor module 100 in accordance with FIG. 3A, wherein heat sink 51 has been removed. Certain constituents of the power semiconductor module 100 that are actually concealed in this plan view are illustrated by dashed lines. The course of the sections 131, 133 and 134 of the thick conductor layer 13 can be discerned from the plan view in accordance with FIG. 3B. From each of the sections 131, 133, 134 of the thick conductor layer 13, a part 131e, 133e and 134e, respectively, protrudes from the first insulation carrier 10 laterally in a direction r perpendicular to the vertical direction v and is provided with an optional mounting opening 36 in each case. The mounting openings 36 serve for electrically connecting the relevant partial section 131e, 133e and 134e led out to a module-external component, for example a voltage source, an intermediate circuit capacitor or a load.

The partial section 131e, serving for connecting the half-bridge to a positive operating potential U+, corresponds to the terminal 34 in FIG. 1. Analogously thereto, the partial section 134e, serving for connecting the half-bridge to a negative operating potential, corresponds to the terminal 35 shown in FIG. 1.

In the example in accordance with FIG. 3B, the external partial sections 131e, 133e and 134e protrude from the first insulation carrier 10 in a lateral direction r on the same side of the first insulation carrier 10. In a departure from this, however, the external partial sections 131e, 133e and 134e can also be led out from the insulation carrier 10 on different sides.

The interconnection to form a half-bridge is effected using the two printed circuit boards 1 and 2. The second printed circuit board 2 is a ceramic substrate having a ceramic insulation carrier 20 provided with a structured second upper metallization layer 21. Optionally, the insulation carrier 20 can also be provided with a lower second metallization layer 22 on its side facing away from the second upper metallization layer 21.

On account of its structuring, the second upper metallization layer 21 has a conductor—track and/or conductor—area structure that can be used for the interconnection of the semiconductor chips 3, 4. The optional second lower metallization layer 22 is preferably embodied as a continuous unstructured metallization layer. Nevertheless it, too, can be structured to form conductor tracks and/or conductor areas. In contrast thereto, both the first upper metallization layer 11 and the first lower metallization layer 12 of the first printed circuit board 1 are structured to form conductor tracks and/or conductor areas.

The mounting of the semiconductor chips 3, 4 on the second upper metallization layer 21 is affected with the aid of connecting layers 41, which can be, for example, solder layers, sintering layers or electrically conductive adhesive layers. Corresponding connecting layers can also be provided between electrically conductive, metallic spacers 40 and the first lower metallization layer 12 and/or the second upper metallization layer 21 in order that the spacers 40 serving for producing electrically conductive connections are mechanically and electrically conductively connected. For further electrically conductive internal connections between the printed circuit boards 1 and 2, it is also possible to use other elements, such as e.g. an electrically conductive metal foil 42.

In addition, the first printed circuit board 1 has at least one plated-through hole 15 extending through the insulation carrier 13 continuously in the vertical direction v. As shown, a plated-through hole 15 can in this case also penetrate through a section 131, 132, 133, 134 of the thick conductor layer 13 and in this case make electrically conductive contact with that section.

At the locations at which the plated-through hole 15 emerges on the top side and the underside of the first insulation carrier 10, the emerging end of the plated-through hole 15 and the adjoining region of the insulation carrier 10 can be covered with a section of the first upper metallization 11 and a section of the first lower metallization 12, respectively, such that these sections are electrically conductively connected to the plated-through hole 15 and thus to the relevant section 131, 132, 133 or 134 of the thick conductor layer 13. In this way, a section of the first upper metallization 11 and of the first lower metallization 12, respectively, can also cover, make contact with and thereby electrically conductively interconnect two or more plated-through holes 15 situated alongside one another.

Besides their function as electrically conductive connecting elements, such plated-through holes 15 can also be used to transport the heat loss occurring in the semiconductor chips 3, 4 during the operation of the power semiconductor module 100 in the direction of a first heat sink 51. For this purpose, one or more plated-through holes 15 can be arranged above the semiconductor chip 3, 4 respectively to be cooled. For this purpose, the first heat sink 51 is brought into thermal contact with that side of the first printed circuit board 1 which faces away from the semiconductor chips 3, 4.

In the case of the arrangement shown, the first heat sink 51 is electrically insulating, for example composed of ceramic, in order to avoid a short circuit, since those sections of the first upper metallization layer 11 with which the first heat sink 51 makes contact are at different electrical potentials during the operation of the power semiconductor module 100. In other configurations, in which such an electrical insulation is not necessary, it is possible to use the first heat sink 51 also composed of electrically conductive material, e.g. a metal, for example copper, aluminum or an alloy comprising at least one of these metals.

The second printed circuit board 2, on its side facing away from the first printed circuit board 1, is in thermal contact with a second heat sink 52. Such a second heat sink 52 can generally be provided in all configurations of the invention, even though it is not illustrated in the following four figures. The second heat sink 52 can consist of electrically conductive material, for example aluminum, copper or an alloy comprising at least one of these metals, since the second heat sink 52 is electrically insulated from the second upper metallization layer 21 on account of the second insulation carrier 20 embodied as a continuous dielectric layer. Nevertheless, the second heat sink 52 can also consist of dielectric material, for example ceramic.

The plan view in accordance with FIG. 3B additionally shows that the first printed circuit board 1 on its side facing away from the second printed circuit board 2, outside the mounting region for the first heat sink 51, can also be populated with one or more further electronic components 5. The conductor tracks and conductor areas required for this purpose are not illustrated. The further electronic components 5 can be, for example, integrated circuits for driving and/or monitoring the power semiconductor module 100.

Figure 4:
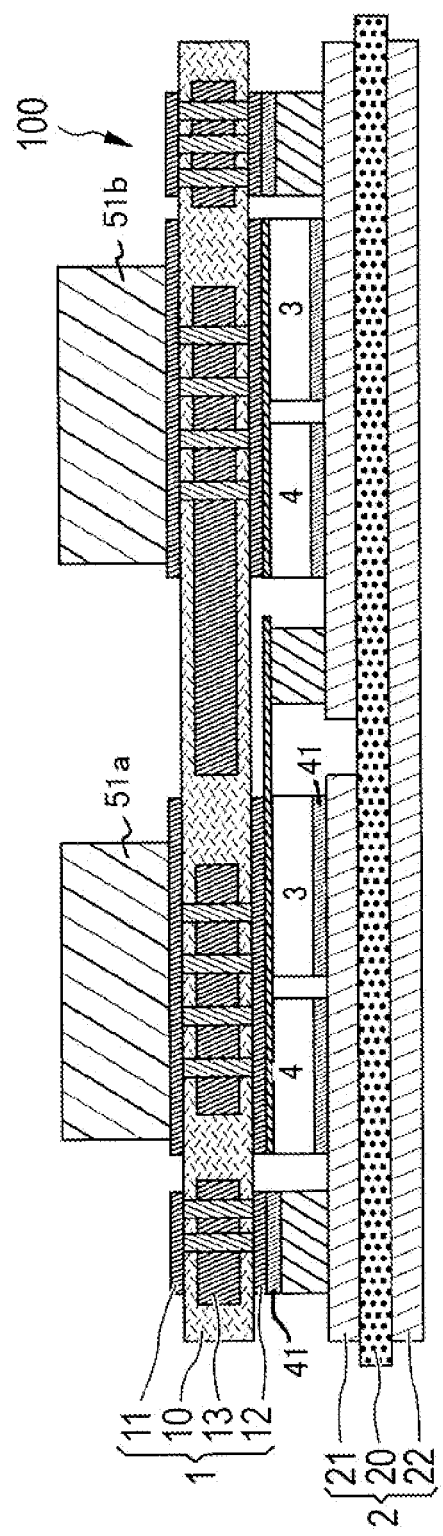
FIG. 4 shows a vertical section through a power semiconductor module which differs from the power semiconductor module in accordance with FIG. 3A in that two heat sinks which are spaced apart from one another and electrically insulated from one another are arranged on the same side of one of the printed circuit boards.

The arrangement in accordance with FIG. 4 corresponds to the arrangement in accordance with FIG. 3A with the sole difference that, instead of a single first heat sink 51, two first heat sinks 51a and 51b are provided. The two first heat sinks 51a and 51b make contact with different sections of the first upper metallization layer 11, and are generally at different electrical potentials during the operation of the power semiconductor module. Through the use of two first heat sinks 51a, 51b electrically insulated from one another, the heat sinks 51a, 51b can in each case be in contact only with a single electrical potential and can then also consist of electrically conductive material such as, for example, copper, aluminum or an alloy comprising at least one of these metals.

Figure 5A:
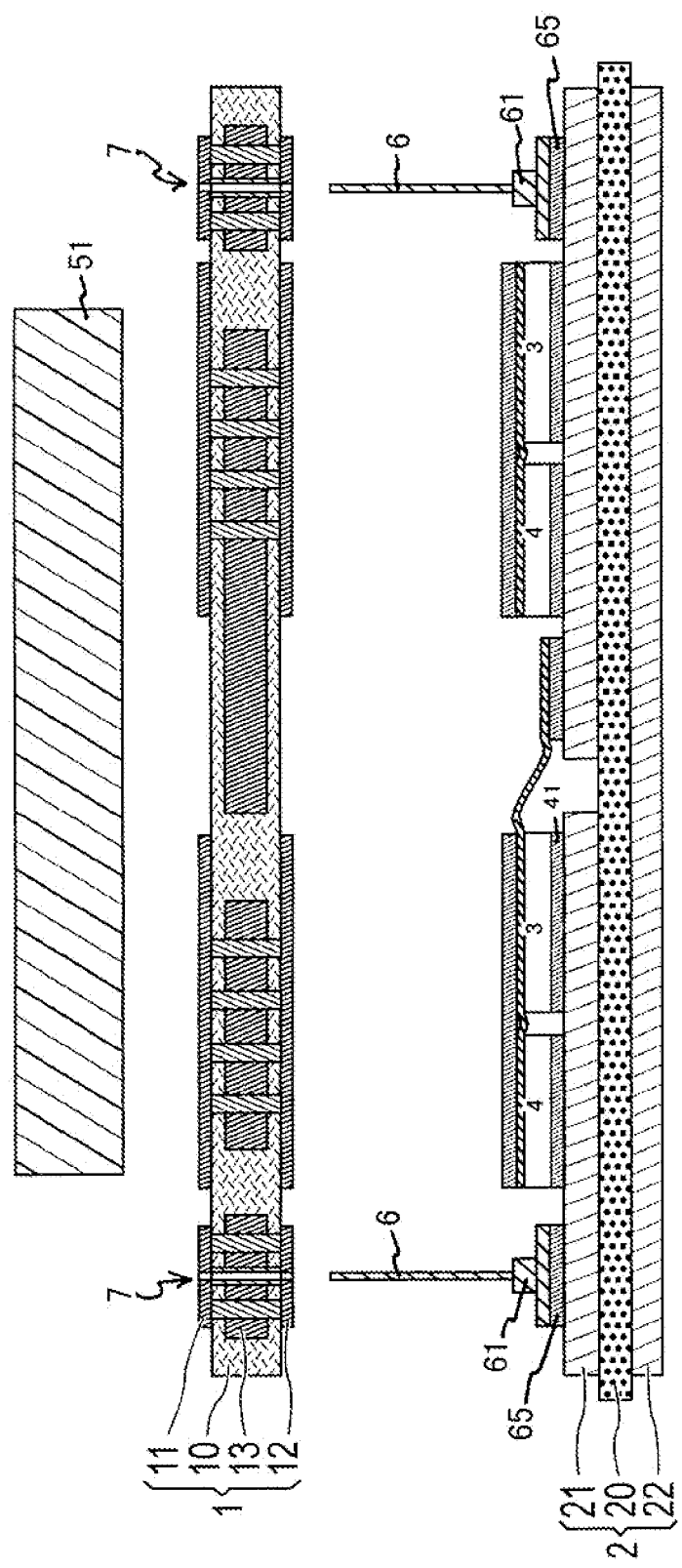
FIG. 5A shows two printed circuit boards which are pluggably connectable to one another before the mounting thereof to form a power semiconductor module.
Figure 5B:
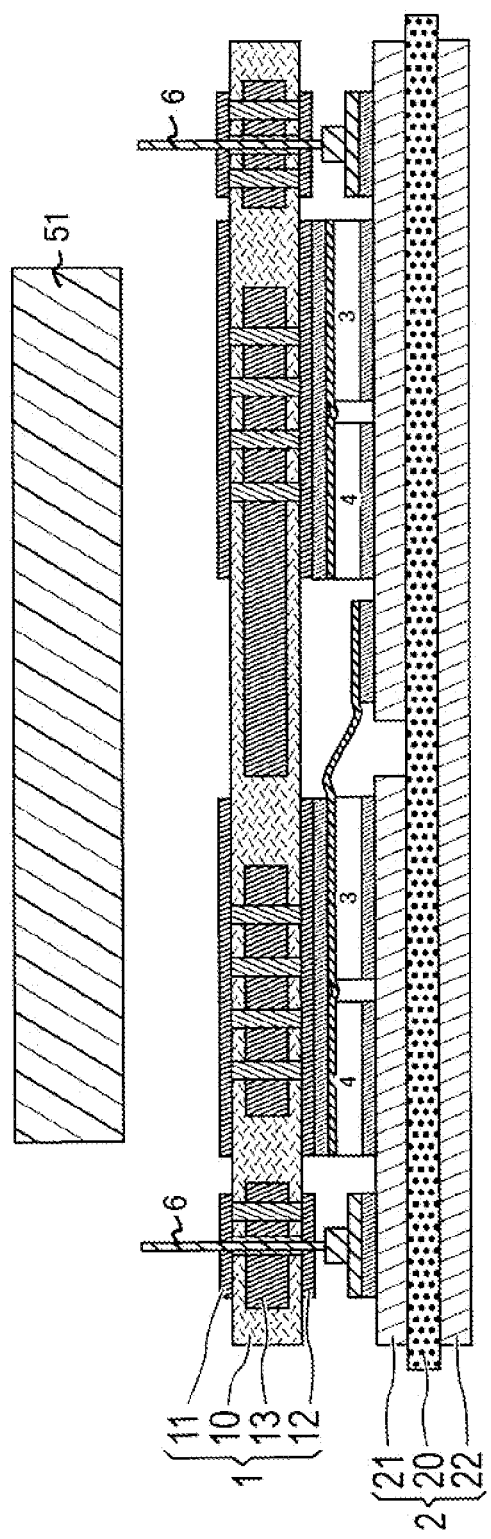
FIG. 5B shows the arrangement in accordance with FIG. 5A after one printed circuit board has been plugged onto the other printed circuit board.
Figure 5C:
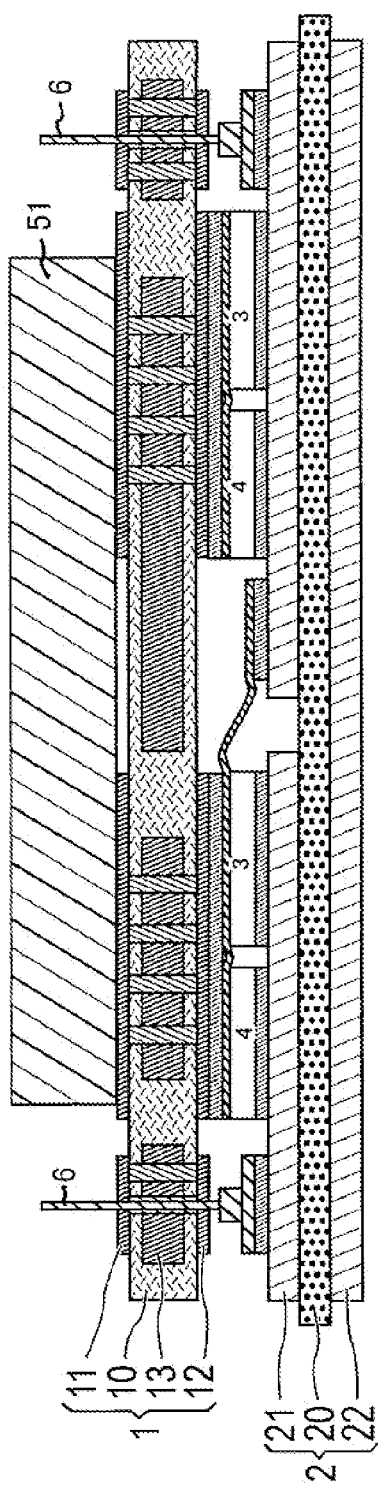
FIG. 5C shows the arrangement in accordance with FIG. 5B after the mounting of a heat sink.

In the exemplary embodiment in accordance with FIG. 5A, it is shown that the connection between the first printed circuit board 1 and the second printed circuit board 2 can also be embodied as a plug connection. For this purpose, at least one electrically conductive contact pin 6 is provided, which, in the exemplary embodiment shown, is electrically conductively connected cohesively to the second upper metallization layer 21 by means of a connecting layer 65, e.g. a solder, sintering or electrically conductive adhesive layer. After this connection has been produced, the first printed circuit board 1 can be plugged onto the contact pin 6. For this purpose, the first printed circuit board 1 is provided with an associated contact hole 7, into which the contact pin 6 can be inserted in order to produce an electrically conductive connection. Conversely, however, it would also be possible for the contact pin 6 to be electrically conductively and cohesively connected to the first lower metallization layer 12 of the first printed circuit board 1 and for the associated contact hole 7 to be situated in the second printed circuit board 2. FIG. 5B shows the arrangement after the first printed circuit board 1 has been plugged onto the contact pins 6, and FIG. 5C shows the arrangement after the subsequent mounting of a first heat sink 51.

Figure 6:
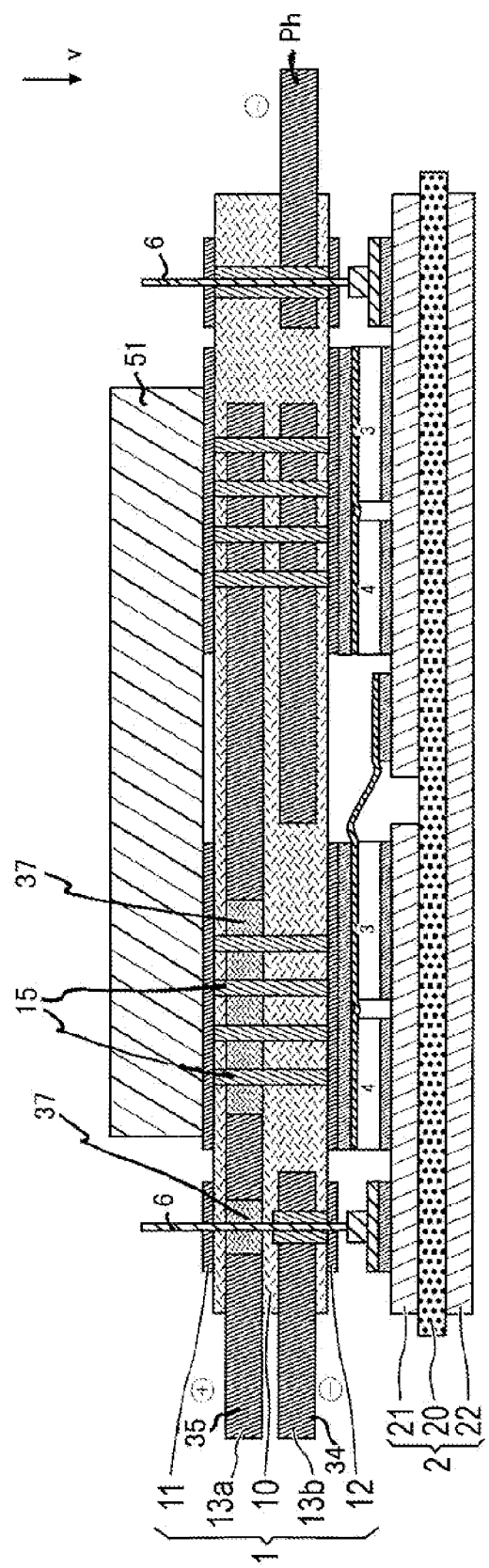
FIG. 6 shows a vertical section through a power semiconductor module comprising two printed circuit boards connected to one another via plug connections, one of which printed circuit boards comprises two conductor layers running parallel to one another.

In accordance with a configuration shown in FIG. 6, wherein the first printed circuit board 1 is plugged in the same way onto the second printed circuit board 2 provided with contact pins 6, it can be seen that the first printed circuit board 1 can also have two thick conductor layers 13a, 13b, each of which, independently of the thickness of the respective other one of the thick conductor layers 13b, 13a, can have a thickness of at least 100 μm or of at least 400 μm. It is thereby possible to achieve conductor track routing with particularly low inductance if sections 34, 35, which serve for connecting a positive and negative operating potential, respectively, protrude from the insulation carrier 10 parallel to one another and on the same side. As is likewise shown in FIG. 6, the phase output Ph can be led out from the insulation carrier 10 at an arbitrary other location, for example on that side of the insulation carrier 10 which faces away from the terminals 34, 35.

As is likewise shown in FIG. 6, one or more dielectric insulation regions 37 can be situated in the plane of a thick conductor layer 13*a*. Such insulation regions 37 can serve for leading plated-through holes 15 or contact pins 6 through the relevant conductor layer 13*a*, without the conductor layer 13*a* being electrically conductively connected to the relevant plated-through hole 15 or to the relevant contact pin 6.

Figure 7:
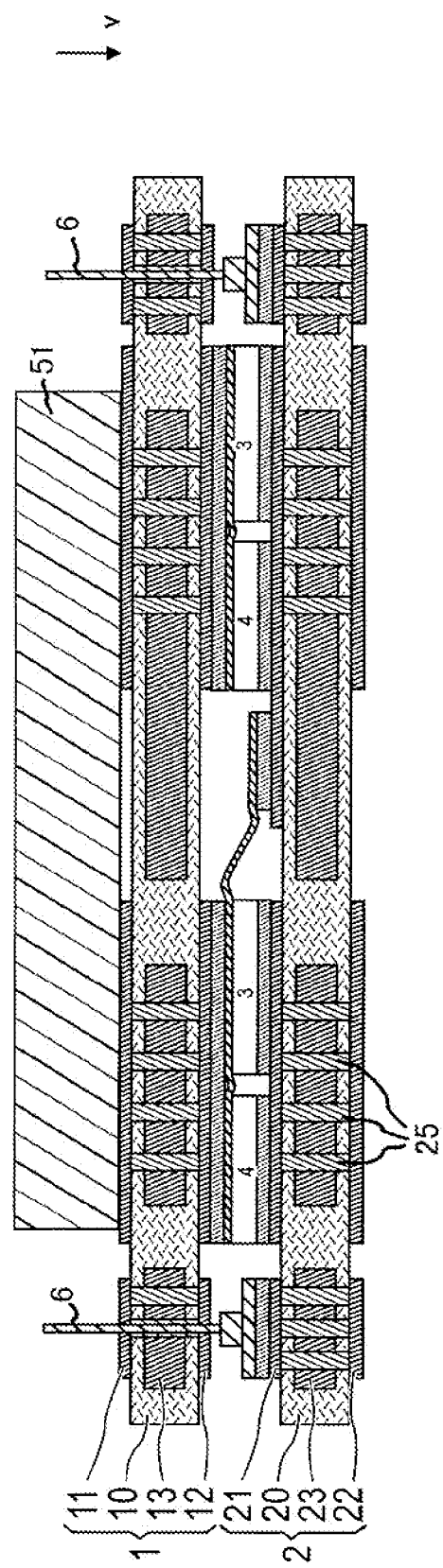
FIG. 7 shows a vertical section through a power semiconductor module comprising two conductor tracks, each of which comprises a thick conductor layer.

As is shown in the exemplary embodiment in accordance with FIG. 7, not only the first printed circuit board 1 but also the second printed circuit board 2 can be embodied as a thick-film printed circuit board in which at least one thick metallization layer 23, having a thickness of at least 100 μm or of at least 400 μm, is wholly or partly embedded into the second insulation carrier 20. The cooling of the semiconductor chips 3, 4 can be effected, as already on the basis of the first plated-through holes 15 of the first printed circuit board 1, by means of one or more second plated-through holes 25 which extend completely through the second insulation carrier 20 in the vertical direction v and in this way enable a continuous thermal connection between the mutually opposite sides of the insulation carrier 20. As a result, the heat loss occurring in a semiconductor chip 3, 4 can be dissipated particularly efficiently to that side of the second printed circuit board 2 which faces away from the relevant semiconductor chip 3, 4, by virtue of one or more plated-through holes being arranged below the semiconductor chip 3, 4 to be cooled in the second printed circuit board 2.

Figure 8:
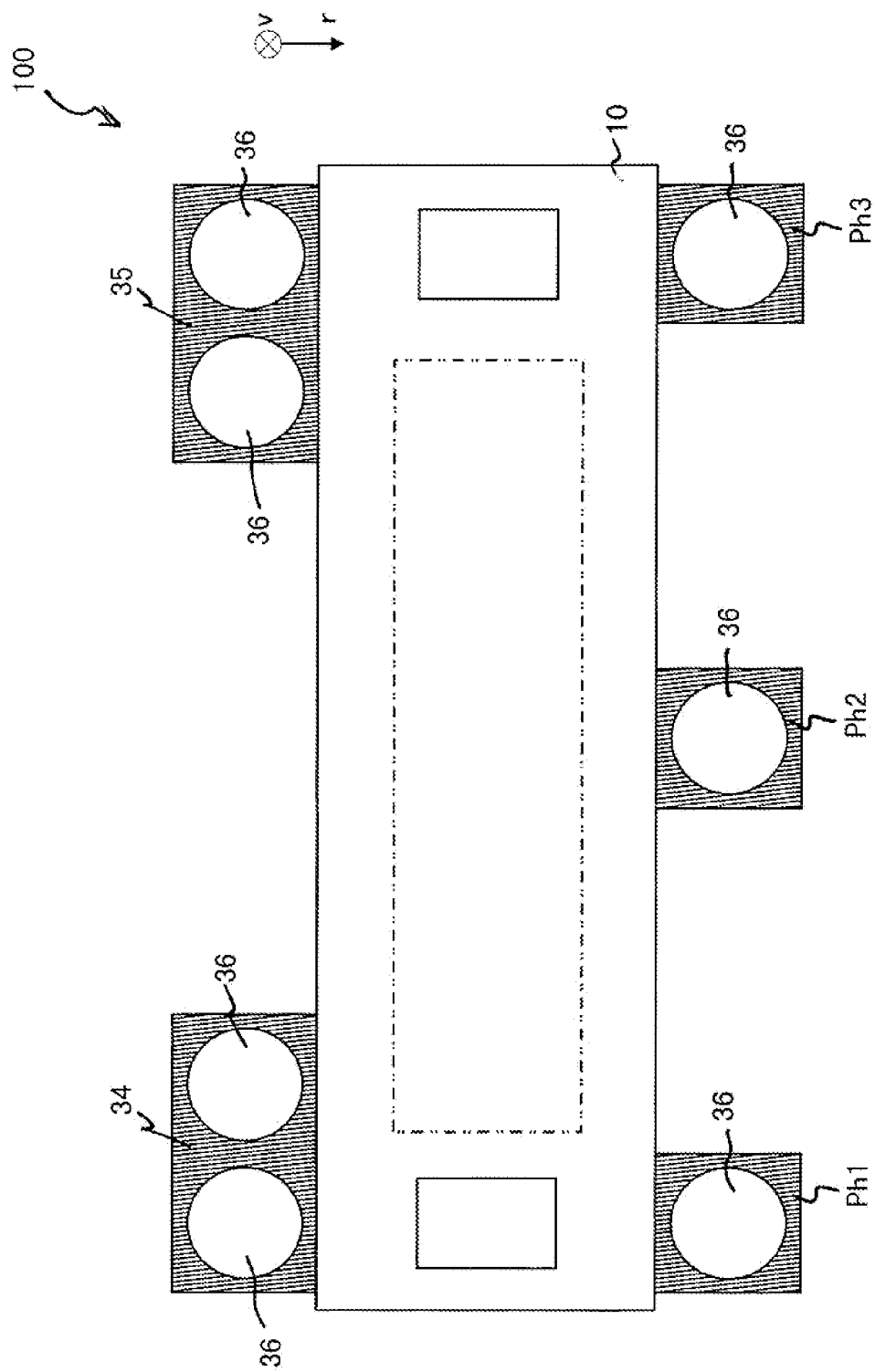
FIG. 8 shows a plan view of a power semiconductor module in which a three-phase half-bridge in accordance with FIG. 2 is realized.

FIG. 8 shows a plan view of a power semiconductor module 100, in which a three-phase half-bridge corresponding to the circuit diagram in accordance with FIG. 2 is realized. The voltage supply of the three half-bridges connected in parallel is affected via common supply terminals 34, 35 for connecting a positive operating potential U+ and for connecting a negative operating potential U−, respectively.

The phase outputs Ph1, Ph2, Ph3 are led out from the first insulation carrier 10 separately in each case perpendicular to the vertical direction v in a lateral direction. The terminals 34, 35, Ph1, Ph2, Ph3 are in each case sections of one or more thick conductor layers 13, 13*a*, 13*b*, 23. The relevant thick conductor layers can be embedded in arbitrary combinations into the first insulation carrier 10 and/or into the second insulation carrier 20.

Figure 9:
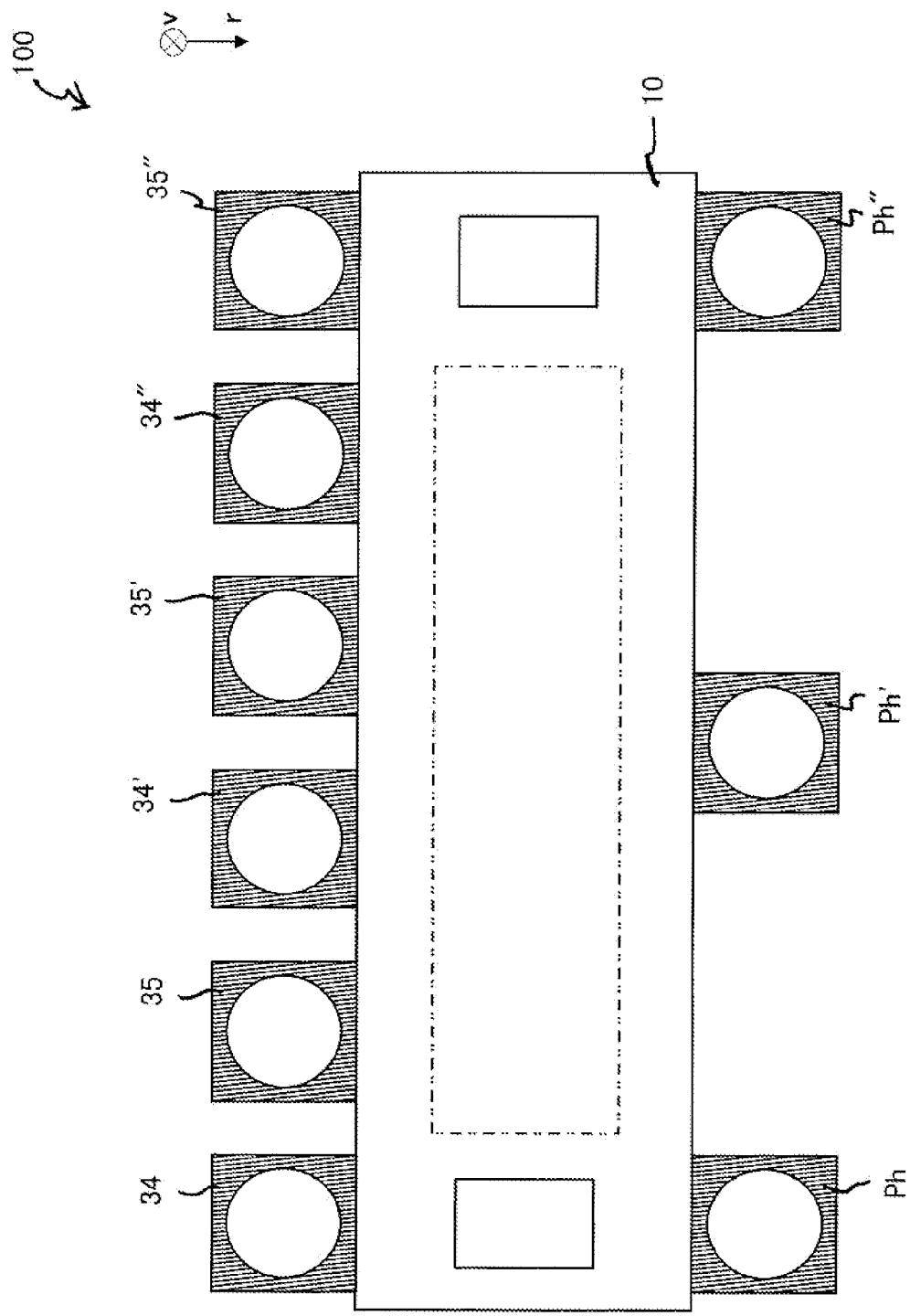
FIG. 9 shows a plan view of a power semiconductor module comprising three individual half-bridges, each of which is constructed in accordance with the circuit diagram in accordance with FIG. 1.

Yet another configuration of a semiconductor module 100 is shown in FIG. 9. In this power semiconductor module 100, three half-bridges independent of one another are realized, each of which has a construction in accordance with the circuit diagram shown in FIG. 1. Since the three half-bridges are electrically independent of one another, each of the half-bridges has its own terminals 34/35/Ph, 34'/35'/Ph', 34"/35"/Ph", which respectively serve for connecting a positive operating potential U+ (34, 34', 34"), for connecting a negative operating potential U− (35, 35', 35"), and respectively as phase output Ph, Ph', Ph". As is shown, all terminals for connecting an operating potential 34, 35, 34', 35', 34", 35" can protrude laterally from the first insulation carrier 10 on one side and all phase terminals Ph, Ph', Ph" can be led out laterally from the insulation carrier 10 on that side of the insulation carrier 10 which faces away from the former side.

Figure 10:
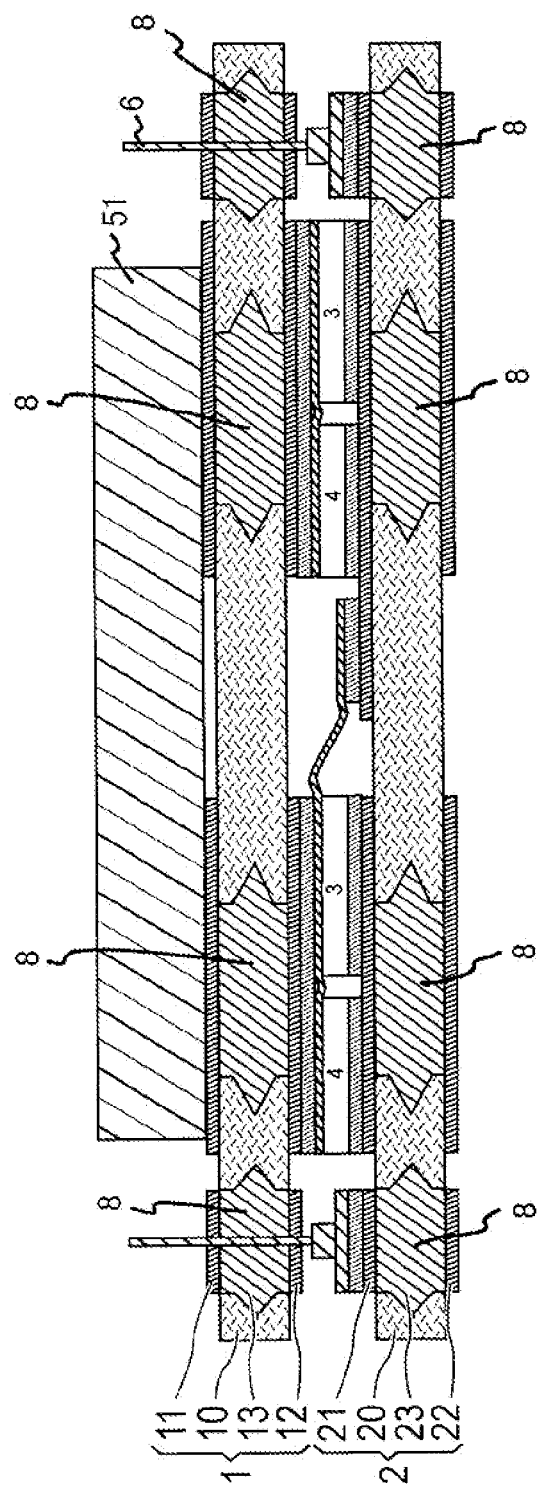
FIG. 10 shows a vertical section through a power semiconductor module comprising two printed circuit boards, each of which has a metallic inlay, via which the heat loss occurring in the semiconductor chips of the module can be dissipated to the opposite side of the respective printed circuit board.

In accordance with yet another exemplary embodiment, shown in FIG. 10, the intention is to illustrate that the heat loss occurring in the semiconductor chips 3, 4 can also be dissipated with the aid of inlays 8 integrated into the first insulation carrier 10 and/or the second insulation carrier 20. Such inlays 8 are metallic inserts which have good electrical and thermal conductivity and which are fixedly anchored in the relevant insulation carrier 10, 20. On account of their solid design in comparison with simple plated-through hole 15 and/or 25, the inlays 8 are particularly well suited to dissipating the operating heat that occurs. In this context, simple plated-through holes are produced electrolytically, for example, during printed circuit board manufacture, wherein, in the case of a plurality of plated-through holes of a printed circuit board, two, more or all of the plated-through holes can be produced in parallel in the printed circuit board, whereas inlays are produced separately and then inserted into the insulation carrier.

Figure 11:
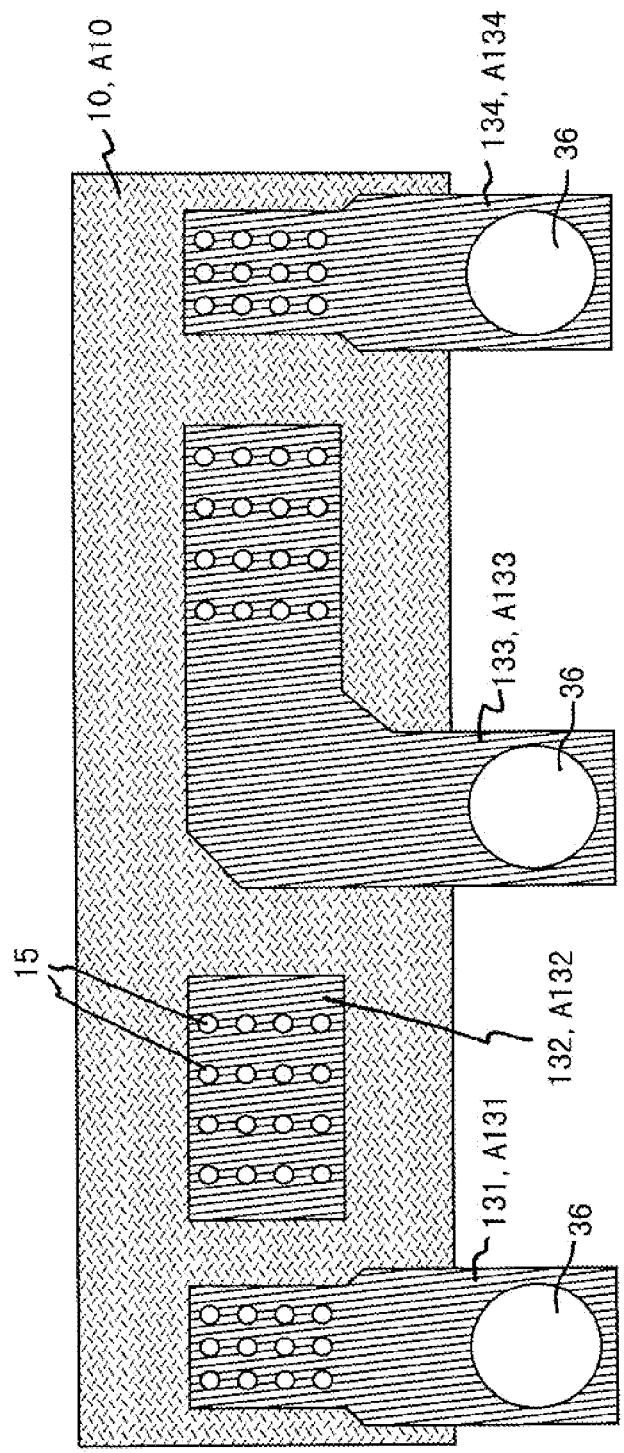
FIG. 11 shows a horizontal section through the thick first conductor layer and the insulation carrier of the first printed circuit board illustrated in FIG. 3A, in a sectional plane perpendicular to the vertical direction.

A further configuration will now be explained by way of example with reference to FIG. 11, which further configuration can correspondingly be provided in any power semiconductor module in accordance with the present invention. FIG. 11 shows a horizontal section through the thick first conductor layer 13 and the insulation carrier 10 of the first printed circuit board 1 illustrated in FIG. 3A in a sectional plane E running perpendicular to the vertical direction v.

In the sectional plane E, the first thick conductor layer 13, 13*a* has a total area A13, given by the sum of the areas A131, A132, A133 and A134 of all the sections 131, 132, 133, 134 of the first thick conductor layer 13, 13*a*, which are intersected by the sectional plane E. No contribution to the total area A13 is made by the mounting openings 36, the plated-through holes 15 or inlays possibly present. In other configurations, the first thick conductor layer 13, 13*a* can also have fewer or more than the four sections 131, 132, 133, 134 shown in the present case.

In a corresponding manner, the first insulation carrier 10 also has a total area A10 in the sectional plane E. In a departure from the example shown, the first insulation carrier 10, in the sectional plane E, can also have two or more sections spaced apart from one another. In this case, the total area A10 would be given by the sum of the areas of all the sections of the first insulation carrier 10 which are intersected by the sectional plane E.

For clarification purposes, in FIG. 11 the areas A131, A132, A133, A134, the sum of which yields the total area A13, are hatched uniformly, while the total area A10 has a patterning deviating from this hatching.

In accordance with one configuration of the invention, the total area A13 of the first thick conductor layer 13 in the sectional plane E can be at least 25% of the total area A10 of the first insulation carrier 10 in the sectional plane E.

Generally, in the case of each first and/or second printed circuit boards 1, 2 of the present invention, the respective thick conductor layers 13, 13*a*, 13*b*, 23 consist completely or to the extent of at least 99% by weight of a material having good electrical conductivity such as e.g. copper, aluminum, silver, gold, or an alloy comprising at least one of these metals.

Moreover, the thick conductor layers 13, 13*a*, 13*b*, 23 can optionally be provided with a thin coating, for example produced electrolytically. Such coatings can serve e.g. to improve the solderability if a partial section of the thick conductor layer 13, 13*a*, 13*b*, 23 that protrudes from the relevant insulation carrier 10, 20 is intended to be soldered. A coating can also serve to improve the adhesion between the thick conductor layer 13, 13*a*, 13*b*, 23 and the relevant insulation carrier 10, 20. In principle, the thick conductor layers of the same printed circuit board 1, 2 can be produced from identical materials, but also from different materials, wherein the materials of different thick conductor layers can be arbitrarily combined with one another.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   a first printed circuit board having a first insulation carrier, and a first upper metallization and a first lower metallization applied to the first insulation carrier on mutually opposite sides;
   a second printed circuit board having a second insulation carrier and a second upper metallization applied to the second insulation carrier, the second printed circuit board being spaced apart from the first printed circuit board in a vertical direction oriented perpendicular to the opposite sides of the first insulation carrier;
   a semiconductor chip disposed between the first printed circuit board and the second printed circuit board and electrically conductively connected at least to the second upper metallization;
   wherein the first lower metallization and the second upper metallization face one another; and
   wherein the first printed circuit board comprises a first thick conductor layer at least partly embedded in the first insulation carrier and which has a thickness of at least 100 μm.

2. The power semiconductor module as claimed in claim 1, wherein the first printed circuit board has an electrically conductive plated-through hole which extends completely through the first insulation carrier in the vertical direction.

3. The power semiconductor module as claimed in claim 2, wherein the plated-through hole is arranged above the semiconductor chip on a side of the semiconductor chip which faces away from the second upper metallization.

4. The power semiconductor module as claimed in claim 2, wherein the plated-through hole extends through a section of the first thick conductor layer and is electrically conductively connected to the section of the first thick conductor layer.

5. The power semiconductor module as claimed in claim 4, wherein a partial section of the section of the first thick conductor layer protrudes out from the first insulation carrier in a lateral direction perpendicular to the vertical direction.

6. The power semiconductor module as claimed in claim 5, wherein the partial section has a mounting opening.

7. The power semiconductor module as claimed in claim 2, further comprising a heat sink arranged on the first upper metallization on a side of the semiconductor chip facing away from the plated-through hole.

8. The power semiconductor module as claimed in claim 7, wherein the heat sink is electrically conductively connected to the semiconductor chip via the first upper metallization, the plated-through hole and the first lower metallization.

9. The power semiconductor module as claimed in claim 1, wherein the second printed circuit board has an electrically conductive plated-through hole which extends completely through the second insulation carrier in the vertical direction.

10. The power semiconductor module as claimed in claim 9, wherein the plated-through hole is arranged on a side of the semiconductor chip facing away from the first lower metallization.

11. The power semiconductor module as claimed in claim 9, further comprising a heat sink arranged on a second lower metallization on a side of the semiconductor chip facing away from the plated-through hole.

12. The power semiconductor module as claimed in claim 11, wherein the heat sink is electrically conductively connected to the semiconductor chip via the second lower metallization, the plated-through hole and the second upper metallization.

13. The power semiconductor module as claimed in claim 1, wherein the second printed circuit board comprises a second thick conductor layer at least partly embedded in the second insulation carrier and which has a thickness of at least 100 μm.

14. The power semiconductor module as claimed in claim 1, wherein the second insulation carrier is a ceramic lamina.

15. The power semiconductor module as claimed in claim 1, wherein the first printed circuit board comprises a further thick conductor layer at least partly embedded in the first insulation carrier, the further thick conductor layer having a thickness of at least 100 μm and being electrically conductively interconnected with the first thick conductor layer by means of at least one of a plated-through hole and an inlay.

16. The power semiconductor module as claimed in claim 1, further comprising an electrically conductive contact pin cohesively connected to at least one of the first upper metallization and the first lower metallization of the first printed circuit board, wherein the electrically conductive contact pin is inserted into a contact hole of the second printed circuit board and electrically conductively connected to at least one of the second upper metallization and the second lower metallization of the second printed circuit board.

17. The power semiconductor module as claimed in claim 1, further comprising an electrically conductive contact pin cohesively connected to at least one of the second upper metallization and a second lower metallization of the second printed circuit board, wherein the electrically conductive contact pin is inserted into a contact hole of the first printed circuit board and electrically conductively connected to at least one of the first upper metallization and the first lower metallization of the first printed circuit board.

18. The power semiconductor module as claimed in claim 1, wherein the first insulation carrier comprises a non-ceramic material.

19. The power semiconductor module as claimed in claim 1, wherein the second insulation carrier comprises a non-ceramic material.

20. The power semiconductor module as claimed in claim 1, wherein the second insulation carrier is a ceramic lamina.

21. The power semiconductor module as claimed in claim 1, wherein a total area of the first thick conductor layer in a sectional plane perpendicular to the vertical direction which runs through the first thick conductor layer is at least 25% of a total area of the first insulation carrier in the sectional plane.

* * * * *

UNITED STATES PATENT AND TRADEMARK OFFICE
CERTIFICATE OF CORRECTION

PATENT NO. : 8,981,553 B2  
APPLICATION NO. : 13/623994  
DATED : March 17, 2015  
INVENTOR(S) : U. Schwarzer et al.

Page 1 of 1

It is certified that error appears in the above-identified patent and that said Letters Patent is hereby corrected as shown below:

In the Claims

Column 10, line 47 (claim 16) please change "the second lower" to -- a second lower --

Signed and Sealed this
Eighteenth Day of August, 2015

Michelle K. Lee
*Director of the United States Patent and Trademark Office*